United States Patent
Khlat et al.

(10) Patent No.: US 10,903,796 B2
(45) Date of Patent: Jan. 26, 2021

(54) VOLTAGE GENERATION CIRCUIT AND RELATED ENVELOPE TRACKING AMPLIFIER APPARATUS

(71) Applicant: Qorvo US, Inc., Greensboro, NC (US)

(72) Inventors: Nadim Khlat, Cugnaux (FR); Michael R. Kay, Summerfield, NC (US); Philippe Gorisse, Brax (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/278,886

(22) Filed: Feb. 19, 2019

(65) Prior Publication Data
US 2020/0127612 A1  Apr. 23, 2020

Related U.S. Application Data

(60) Provisional application No. 62/748,122, filed on Oct. 19, 2018.

(51) Int. Cl.
*H03F 1/02* (2006.01)
*H03F 3/213* (2006.01)
*H03F 3/20* (2006.01)

(52) U.S. Cl.
CPC ........... *H03F 1/0233* (2013.01); *H03F 3/213* (2013.01); *H03F 2200/102* (2013.01); *H03F 2200/129* (2013.01); *H03F 2200/451* (2013.01)

(58) Field of Classification Search
USPC .......................... 330/297, 279, 134, 150, 136
See application file for complete search history.

(56) References Cited

U.S. PATENT DOCUMENTS

| | | |
|---|---|---|
| 6,529,716 B1 | 3/2003 | Eidson et al. |
| 6,788,151 B2 | 9/2004 | Shvarts et al. |
| 8,019,289 B2 | 9/2011 | Gorbachov |
| 8,290,453 B2 | 10/2012 | Yoshihara |
| 8,385,859 B2 | 2/2013 | Hamano |

(Continued)

OTHER PUBLICATIONS

U.S. Appl. No. 16/193,513, filed Nov. 16, 2018.

(Continued)

*Primary Examiner* — Hieu P Nguyen
(74) *Attorney, Agent, or Firm* — Withrow & Terranova, P.L.L.C.

(57) ABSTRACT

A voltage generation circuit and related envelope tracking (ET) amplifier apparatus is provided. In examples discussed herein, a voltage generation circuit can be provided in an ET amplifier apparatus to provide a supply voltage to a voltage amplifier(s) that is configured to generate an ET voltage for an amplifier circuit(s). In a non-limiting example, the voltage amplifier(s) receives an ET target voltage signal corresponding to a time-variant target voltage envelope and generates the ET voltage conforming to the time-variant target voltage envelope. The voltage generation circuit is configured to generate one or more supply voltages and selectively provide one of the supply voltages to the voltage amplifier(s) in accordance to the time-variant target voltage envelope. By selectively providing the supply voltage based on the time-variant target voltage envelope, it may be possible to improve efficiency of the voltage amplifier, thus helping to improve efficiency and linearity of the amplifier circuit(s).

19 Claims, 7 Drawing Sheets

(56) References Cited

U.S. PATENT DOCUMENTS

| | | |
|---|---|---|
| 8,476,976 B2 | 7/2013 | Wimpenny |
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 * | 8/2014 | Tseng ............... H03F 1/0227 330/127 |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 * | 6/2016 | Rozek ............... H02M 3/07 |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Kesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 | 8/2014 | Wimpenny |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |

OTHER PUBLICATIONS

U.S. Appl. No. 16/250,229, filed Jan. 17, 2019.
U.S. Appl. No. 16/267,740, filed Feb. 5, 2019.
U.S. Appl. No. 16/263,316, filed Jan. 31, 2019.
U.S. Appl. No. 16/270,119, filed Feb. 7, 2019.
U.S. Appl. No. 16/273,288, filed Feb. 12, 2019.
U.S. Appl. No. 16/250,298, filed Jan. 17, 2019.
U.S. Appl. No. 16/267,779, filed Feb. 5, 2019.
U.S. Appl. No. 16/263,368, filed Jan. 31, 2019.
Non-Final Office Action for U.S. Appl. No. 16/263,368, dated Dec. 26, 2019, 6 pages.
Notice of Allowance for U.S. Appl. No. 16/273,288, dated Dec. 13, 2019, 8 pages.
Non-Final Office Action for U.S. Appl. No. 16/263,316, dated Dec. 23, 2019, 9 pages.
Notice of Allowance for U.S. Appl. No. 16/193,513, dated Mar. 25, 2020, 8 pages.
Non-Final Office Action for U.S. Appl. No. 16/250,229, dated Apr. 29, 2020, 7 pages.

(56) References Cited

OTHER PUBLICATIONS

Non-Final Office Action for U.S. Appl. No. 16/267,740, dated Apr. 30, 2020, 10 pages.
Final Office Action for U.S. Appl. No. 16/263,316, dated May 13, 2020, 10 pages.
Notice of Allowance for U.S. Appl. No. 16/270,119, dated Jun. 18, 2020, 9 pages.
Quayle Action for U.S. Appl. No. 16/267,779, dated May 1, 2020, 8 pages.
Final Office Action for U.S. Appl. No. 16/263,368, dated May 22, 2020, 9 pages.
Notice of Allowance for U.S. Appl. No. 16/250,229, dated Sep. 22, 2020, 7 pages.
Non-Final Office Action for U.S. Appl. No. 16/263,316, dated Jul. 17, 2020, 4 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Quayle Action for U.S. Appl. No. 16/267,740, dated Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,768, dated Oct. 27, 2020, 9 pages.
Quayle Action for U.S. Appl. No. 16/514,339, dated Nov. 19, 2020, 9 pages.

\* cited by examiner

VOLTAGE GENERATION CIRCUIT AND RELATED ENVELOPE TRACKING AMPLIFIER APPARATUS

RELATED APPLICATION

This application claims the benefit of U.S. provisional patent application No. 62/748,122, filed on Oct. 19, 2018, the disclosure of which is incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Notably, the better the time-variant voltage envelope tracks the time-variant power envelope, the higher efficiency can be achieved in the ET power amplifier(s). In this regard, it may be necessary for the ET system to constantly adjust the time-variant voltages applied to the ET power amplifier(s) to ensure that the ET power amplifier(s) can consistently operate at a desired efficiency for any given instantaneous power requirement of the RF signal(s).

SUMMARY

Aspects disclosed in the detailed description include a voltage generation circuit and related envelope tracking (ET) amplifier apparatus. In examples discussed herein, a voltage generation circuit can be provided in an ET amplifier apparatus to provide a supply voltage to a voltage amplifier(s) that is configured to generate an ET voltage for an amplifier circuit(s). In a non-limiting example, the voltage amplifier(s) receives an ET target voltage signal corresponding to a time-variant target voltage envelope and generates the ET voltage conforming to the time-variant target voltage envelope. The voltage generation circuit can be configured to generate one or more supply voltages and selectively provide one of the supply voltages to the voltage amplifier(s) in accordance to the time-variant target voltage envelope. By selectively providing the supply voltage based on the time-variant target voltage envelope, it may be possible to improve efficiency of the voltage amplifier, thus helping to improve efficiency and linearity of the amplifier circuit(s).

In one aspect, a voltage generation circuit is provided. The voltage generation circuit includes a voltage source configured to generate a constant voltage based on a battery voltage. The voltage generation circuit also includes a multi-voltage generation circuit configured to generate one or more supply voltages based on the constant voltage. The voltage generation circuit also includes a voltage controller. The voltage controller is configured to receive a target voltage signal corresponding to a time-variant target voltage envelope. The voltage controller is also configured to determine a selected supply voltage among the one or more supply voltages based on the time-variant target voltage envelope. The voltage controller is also configured to cause the voltage generation circuit to output the selected supply voltage.

In another aspect, an ET amplifier apparatus is provided. The ET amplifier apparatus includes an amplifier circuit configured to amplify a radio frequency (RF) signal based on an ET voltage and a target voltage signal corresponding to a time-variant target voltage envelope. The ET amplifier apparatus also includes an ET integrated circuit (ETIC). The ETIC includes a voltage amplifier configured to generate the ET voltage based on a supply voltage. The ETIC also includes a voltage generation circuit. The voltage generation circuit includes a voltage source configured to generate a constant voltage based on a battery voltage. The voltage generation circuit also includes a multi-voltage generation circuit configured to generate one or more supply voltages based on the constant voltage. The voltage generation circuit also includes a voltage controller. The voltage controller is configured to receive the target voltage signal corresponding to the time-variant target voltage envelope. The voltage controller is also configured to determine a selected supply voltage among the one or more supply voltages based on the time-variant target voltage envelope. The voltage controller is also configured to cause the voltage generation circuit to output the selected supply voltage to the voltage amplifier as the supply voltage.

In another aspect, an ET amplifier apparatus is provided. The ET amplifier apparatus includes a power amplifier integrated circuit (PAIC). The PAIC includes an amplifier circuit configured to amplify an RF signal based on an ET voltage and a target voltage signal corresponding to a time-variant target voltage envelope. The PAIC also includes a voltage amplifier configured to generate the ET voltage based on a supply voltage. The ET amplifier apparatus also includes an ETIC. The ETIC includes a voltage generation circuit. The voltage generation circuit includes a voltage source configured to generate a constant voltage based on a battery voltage. The voltage generation circuit also includes a multi-voltage generation circuit configured to generate one or more supply voltages based on the constant voltage. The voltage generation circuit also includes a voltage controller. The voltage controller is configured to receive the target voltage signal corresponding to the time-variant target voltage envelope. The voltage controller is also configured to determine a selected supply voltage among the one or more supply voltages based on the time-variant target voltage envelope. The voltage controller is also configured to cause the voltage generation circuit to output the selected supply voltage to the voltage amplifier as the supply voltage.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
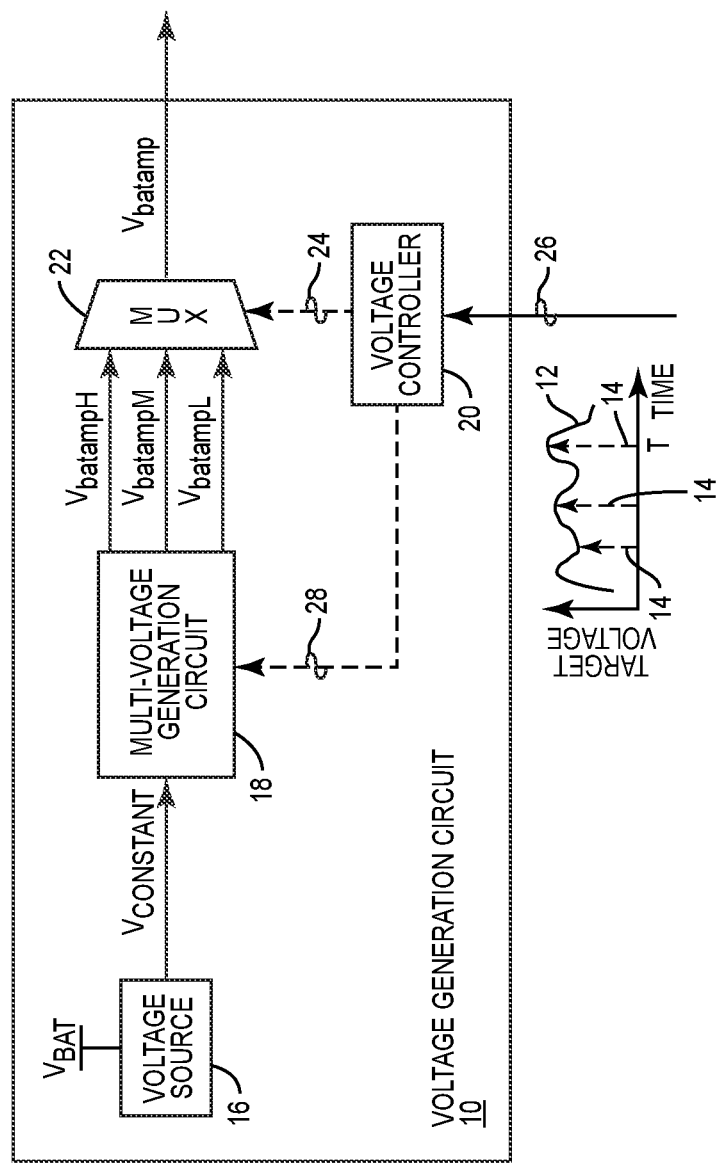
FIG. 1 is a schematic diagram of an exemplary voltage generation circuit configured according to an embodiment of the present disclosure to output a selected supply voltage among one or more internally generated supply voltages in accordance to a time-variant target voltage envelope.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a voltage generation circuit and related envelope tracking (ET) amplifier apparatus. In examples discussed herein, a voltage generation circuit can be provided in an ET amplifier apparatus to provide a supply voltage to a voltage amplifier(s) that is configured to generate an ET voltage for an amplifier circuit(s). In a non-limiting example, the voltage amplifier(s) receives an ET target voltage signal corresponding to a time-variant target voltage envelope and generates the ET voltage conforming to the time-variant target voltage envelope. The voltage generation circuit can be configured to generate one or more supply voltages and selectively provide one of the supply voltages to the voltage amplifier(s) in accordance to the time-variant target voltage envelope. By selectively providing the supply voltage based on the time-variant target voltage envelope, it may be possible to improve efficiency of the voltage amplifier, thus helping to improve efficiency and linearity of the amplifier circuit(s).

FIG. 1 is a schematic diagram of an exemplary voltage generation circuit 10 configured according to an embodiment of the present disclosure to output a selected supply voltage $V_{batamp}$ among one or more internally generated supply voltages $V_{batampL}$, $V_{batampM}$, and $V_{batampH}$ in accordance to a time-variant target voltage envelope 12. In a non-limiting example, the supply voltage $V_{batampL}$ (also referred to as "low supply voltage") is lower than the supply voltage $V_{batampM}$ (also referred to as "medium supply voltage") and the supply voltage $V_{batampM}$ is lower than the supply voltage $V_{batampH}$ (also referred to as "high supply voltage") ($V_{batampL} < V_{batampM} < V_{batampH}$). Notably, the supply voltages $V_{batampL}$, $V_{batampM}$, and $V_{batampH}$, as illustrated in FIG. 1, are merely non-limiting examples. It should be appreciated that the voltage generation circuit 10 can be further configured to generate fewer or more supply voltages without altering the operational principles discussed herein.

In a non-limiting example, the time-variant target voltage envelope 12 defines a number of target voltages 14 that may vary over time. In this regard, in examples discussed herein, the voltage generation circuit 10 is configured to determine the selected supply voltage $V_{batamp}$ as being a closest supply voltage among the supply voltages $V_{batampL}$, $V_{batampM}$, and $V_{batampH}$ that is greater than or equal to an instantaneous target voltage 14 at a given time T. As discussed later in FIGS. 3 and 4, by outputting the selected supply voltage $V_{batamp}$ based on the time-variant target voltage envelope 12, it may be possible to improve efficiency and maintain linearity in an ET amplifier apparatus employing the voltage generation circuit 10.

The voltage generation circuit 10 can be configured to include a voltage source 16, a multi-voltage generation circuit 18, a voltage controller 20, and a multiplexer 22 (denoted as "MUX"). Although the voltage controller 20 is shown to be inside the voltage generation circuit 10, it should be appreciated that the voltage controller 20 may be provided external to the voltage generation circuit 10 without affecting functionality of the voltage controller 20.

The voltage source 16, which may be an inductor-based buck-boost circuit or a capacitor-based buck-boost circuit, is configured to generate a constant voltage $V_{CONSTANT}$ based on a battery voltage $V_{BAT}$. In a non-limiting example, the battery voltage $V_{BAT}$ can vary between 3.2V and 4.5V over time, while the voltage source 16 is configured to maintain the constant voltage $V_{CONSTANT}$ at approximately 3.8V. In this regard, the voltage source 16 may operate in a buck mode when the battery voltage $V_{BAT}$ is higher than or equal to 3.8V and in a boost mode when the battery voltage $V_{BAT}$ is lower than 3.8V.

The multi-voltage generation circuit 18 is configured to receive the constant voltage $V_{CONSTANT}$ from the voltage source 16 and generate the supply voltages $V_{batampL}$, $V_{batampM}$, and $V_{batampH}$ based on the constant voltage $V_{CONSTANT}$. The multiplexer 22 may be configured to receive the supply voltages $V_{batampL}$, $V_{batampM}$, and $V_{batampH}$ from the multi-voltage generation circuit 18 and output the selected supply voltage $V_{batamp}$ in response to receiving a voltage selection signal 24 from the voltage controller 20.

The voltage controller 20, which can be a microprocessor, a microcontroller, or a field-programmable gate array (FPGA) for example, is configured to receive a target voltage signal 26 that corresponds to the time-variant target voltage envelope 12. Accordingly, the voltage controller 20 can be configured to determine the selected supply voltage $V_{batamp}$ based on the target voltages 14 defined by the time-variant target voltage envelope 12. In a non-limiting example, the voltage controller 20 can employ a comparator(s) for determining the selected supply voltage $V_{batamp}$ based on the target voltages 14. More specifically, the voltage controller 20 is configured to determine the selected supply voltage $V_{batamp}$ as being the closest supply voltage among the supply voltages $V_{batampL}$, $V_{batampM}$, and $V_{batampH}$ that is greater than or equal to the instantaneous target voltage 14 at the given time T. For example, if the voltage controller 20 determines that the instantaneous target voltage 14 at the given time T is greater than the low supply voltage $V_{batampL}$, but less than the medium supply voltage $V_{batampM}$ and the high supply voltage $V_{batampM}$, then the voltage controller 20 can provide the voltage selection signal 24 to the multiplexer 22 to output the medium supply voltage $V_{batampM}$ as the selected supply voltage $V_{batamp}$.

Studies have shown that the target voltages 14, as defined by the time-variant target voltage envelope 12, may be lower than or equal to 3.8V in approximately 94% of the time. As such, it may be more efficient to configure the multi-voltage generation circuit 18 to generate the low supply voltage $V_{batampL}$ that equals the constant voltage $V_{CONSTANT}$ (e.g., 3.8V). In this regard, the voltage controller 20 may also provide a voltage generation signal 28 to cause the multi-voltage generation circuit 18 to generate the low supply voltage $V_{batampL}$ at the constant voltage $V_{CONSTANT}$. As is discussed next in FIGS. 2A-2C, the voltage controller 20 may also use the voltage generation signal 28 to cause the multi-voltage generation circuit 18 to flexibly generate any number of supply voltages and at any desirable voltage levels.

Figure 2A:
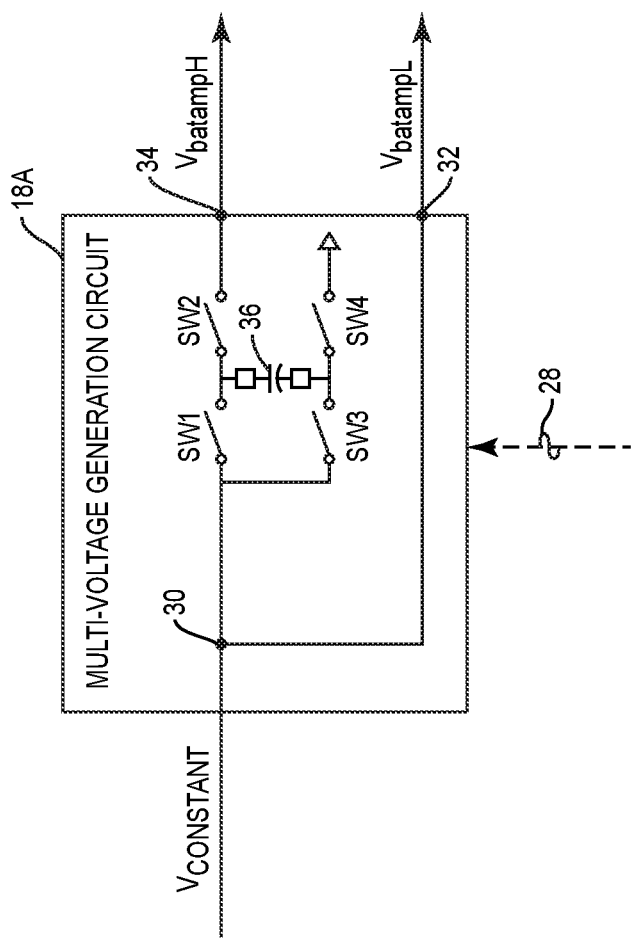
FIG. 2A is a schematic diagram of an exemplary multi-voltage generation circuit, which may be provided in the voltage generation circuit of FIG. 1 to generate a low supply voltage and a high supply voltage.

FIG. 2A is a schematic diagram of an exemplary multi-voltage generation circuit 18A, which may be provided in the voltage generation circuit 10 of FIG. 1 to generate the low supply voltage $V_{batampL}$ and the high supply voltage $V_{batampH}$. Common elements between FIGS. 1 and 2A are shown therein with common element numbers and will not be re-described herein.

The multi-voltage generation circuit 18A includes an input node 30 configured to receive the constant voltage $V_{CONSTANT}$. The multi-voltage generation circuit 18A includes a first output node 32 and a second output node 34 configured to output the low supply voltage $V_{batampL}$ and the high supply voltage $V_{batampH}$, respectively. The multi-voltage generation circuit 18A includes a first switch SW1, a second switch SW2, a third switch SW3, and a fourth switch SW4. The first switch SW1 and the second switch SW2 are coupled in series between the input node 30 and the second output node 34. The third switch SW3 and the fourth switch SW4 are coupled in series between the input node 30 and the first output node 32. The multi-voltage generation circuit 18A includes a fly capacitor 36 having one end coupled in between the first switch SW1 and the second switch SW2, and another end coupled in between the third switch SW3 and the fourth switch SW4.

In a non-limiting example, the multi-voltage generation circuit 18A can be controlled by the voltage generation signal 28 to generate the low supply voltage $V_{batampL}$ at the constant voltage $V_{CONSTANT}$ ($V_{batampL} = V_{CONSTANT}$) and the high supply voltage $V_{batampH}$ at two times the low supply voltage $V_{batampL}$ ($V_{batampH} = 2 \times V_{batampL}$). To generate the high supply voltage $V_{batampH}$ at $2 \times V_{batampL}$, the voltage generation signal 28 first causes the first switch SW2 and the fourth switch SW4 to be closed, and the second switch SW2 and the third switch SW3 to be opened. As such, the fly capacitor 36 can be charged up to the constant voltage $V_{CONSTANT}$ (and thus the low supply voltage $V_{batampL}$). Subsequently, the voltage generation signal 28 causes the first switch SW2 and the fourth switch SW4 to be opened, and the second switch SW2 and the third switch SW3 to be closed. Accordingly, the high supply voltage $V_{batampH}$ can be outputted at $2 \times V_{CONSTANT}$ or $2 \times V_{batampL}$.

Figure 2B:
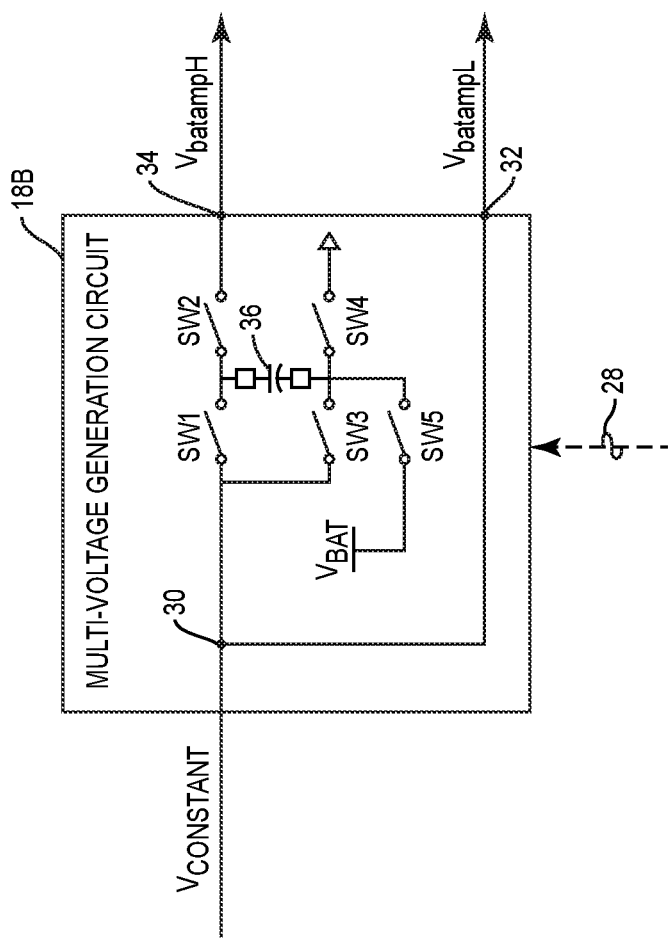
FIG. 2B is a schematic diagram of an exemplary multi-voltage generation circuit, which may be provided in the voltage generation circuit of FIG. 1 to generate a low supply voltage and a high supply voltage.

FIG. 2B is a schematic diagram of an exemplary multi-voltage generation circuit 18B, which may be provided in the voltage generation circuit 10 of FIG. 1 to generate the low supply voltage $V_{batampL}$ and the high supply voltage $V_{batampH}$. Common elements between FIGS. 1, 2A, and 2B are shown therein with common element numbers and will not be re-described herein.

The multi-voltage generation circuit 18B further includes a fifth switch SW5 having one end coupled in series to the fly capacitor 36 and another end coupled to the battery voltage $V_{BAT}$. In a non-limiting example, the multi-voltage generation circuit 18B can be controlled by the voltage generation signal 28 to generate the low supply voltage $V_{batampL}$ at the constant voltage $V_{CONSTANT}$ ($V_{batampL} = V_{CONSTANT}$). The multi-voltage generation circuit 18B can also be controlled by the voltage generation signal 28 to generate the high supply voltage $V_{batampH}$ that equals $2 \times V_{batampL}$ ($V_{batampH} = 2 \times V_{batampL}$) or the low supply voltage $V_{batampL}$ plus the battery voltage $V_{BAT}$ ($V_{batampH} = V_{batampL} + V_{BAT}$). To generate the high supply voltage $V_{batampH}$ that equals $V_{batampL} + V_{BAT}$, the voltage generation signal 28 can be so generated to cause the fifth switch SW5 and the second switch SW2 to be closed, and the first switch SW1, the third switch SW3, and the fourth switch SW4 to be opened. Accordingly, the high supply voltage $V_{batampH}$ can be outputted at $V_{batampL} + V_{BAT}$.

Figure 2C:
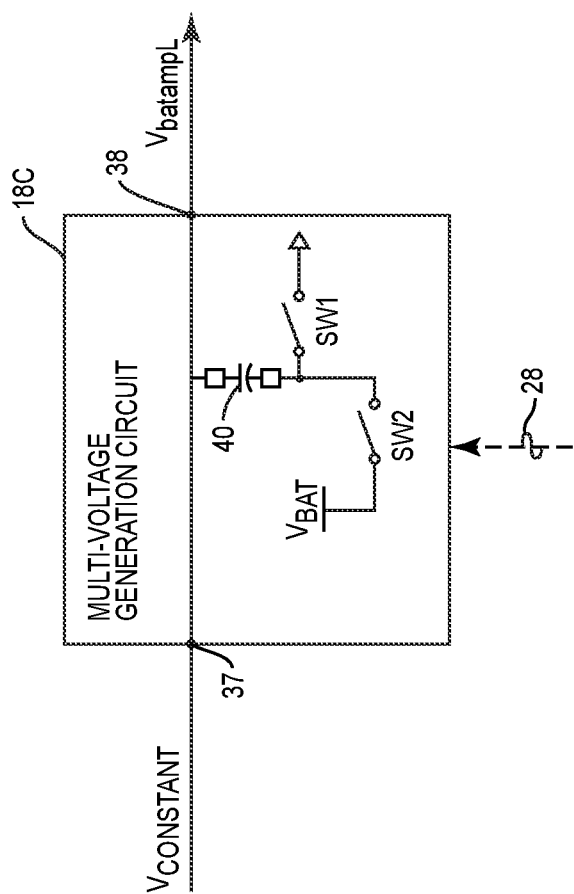
FIG. 2C is a schematic diagram of an exemplary multi-voltage generation circuit, which may be provided in the voltage generation circuit of FIG. 1 to generate a low supply voltage.

FIG. 2C is a schematic diagram of an exemplary multi-voltage generation circuit 18C, which may be provided in the voltage generation circuit 10 of FIG. 1 to generate the low supply voltage $V_{batampL}$. Common elements between FIGS. 1 and 2C are shown therein with common element numbers and will not be re-described herein.

The multi-voltage generation circuit 18C includes an input node 37 configured to receive the constant voltage $V_{CONSTANT}$ and an output node 38 configured to output the low supply voltage $V_{batampL}$. The multi-voltage generation circuit 18C includes a fly capacitor 40 having one end coupled in between the input node 37 and the output node 38. The fly capacitor 40 has another end coupled to a first switch SW1 and a second switch SW2.

In a non-limiting example, the multi-voltage generation circuit 18C can be controlled by the voltage generation signal 28 to generate the low supply voltage $V_{batampL}$ at the constant voltage $V_{CONSTANT}$ ($V_{batampL} = V_{CONSTANT}$). The multi-voltage generation circuit 18C can also be controlled by the voltage generation signal 28 to generate the low supply voltage $V_{batampL}$ that equals the constant voltage $V_{CONSTANT}$ plus the battery voltage $V_{BAT}$ ($V_{batampL} = V_{CONSTANT} + V_{BAT}$). To output the low supply voltage $V_{batampL}$ at the constant voltage $V_{CONSTANT}$, the voltage generation signal 28 may be generated to open both the first switch SW1 and the second switch SW2. To output the low supply voltage $V_{batampL}$ at the constant voltage $V_{CONSTANT}$ plus the battery voltage $V_{BAT}$, the voltage generation signal 28 may first close the first switch SW1 and open the second switch SW2 to charge the fly capacitor 40 to the constant voltage $V_{CONSTANT}$. Subsequently, the voltage generation signal 28 may open the first switch SW1 and close the second switch SW2 to output the low supply voltage $V_{batampL}$ at the constant voltage $V_{CONSTANT}$ plus the battery voltage $V_{BAT}$.

Figure 3:
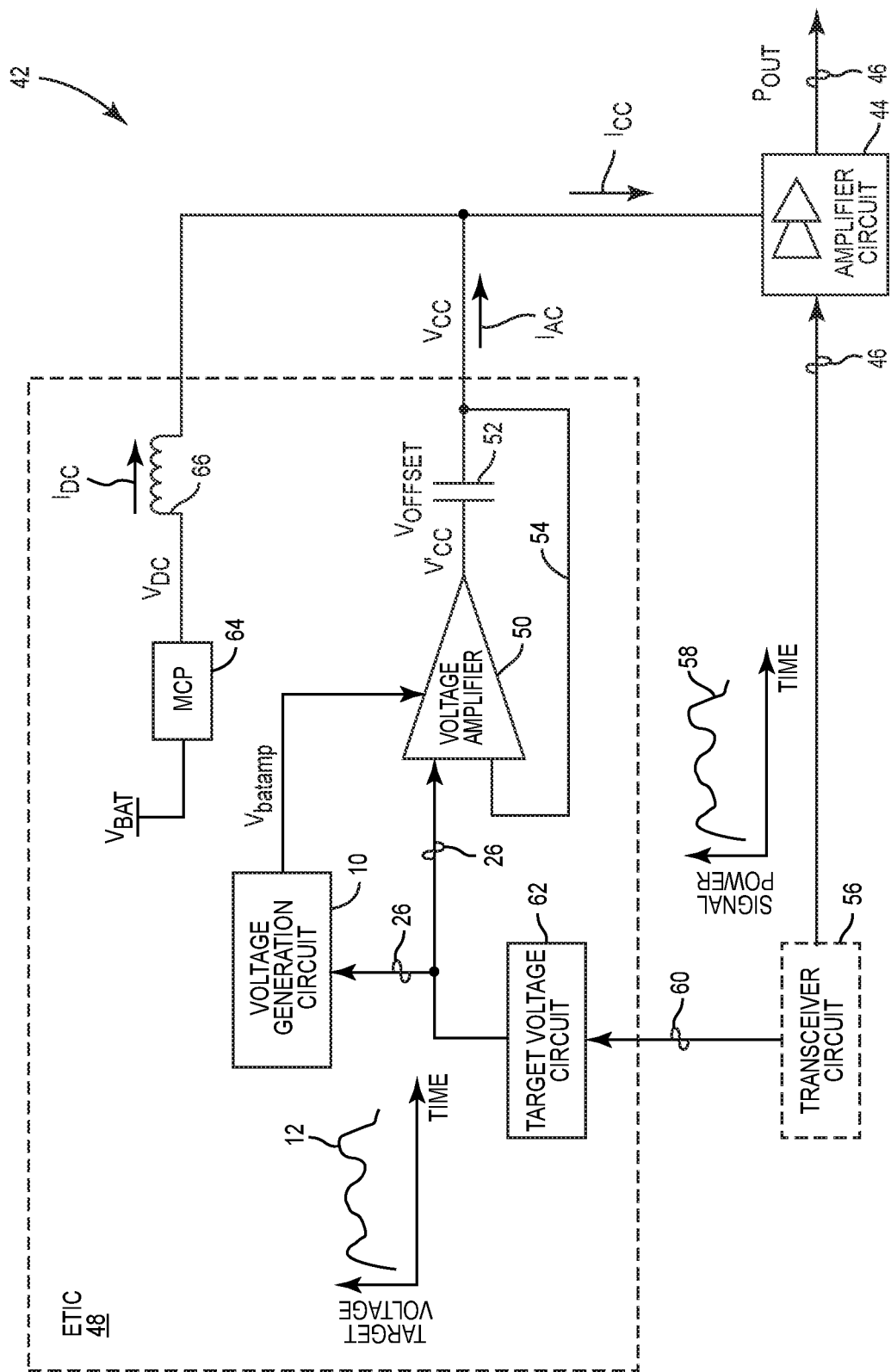
FIG. 3 is a schematic diagram of an exemplary ET amplifier apparatus configured to incorporate the voltage generation circuit of FIG. 1 according to one embodiment of the present disclosure.
Figure 4:
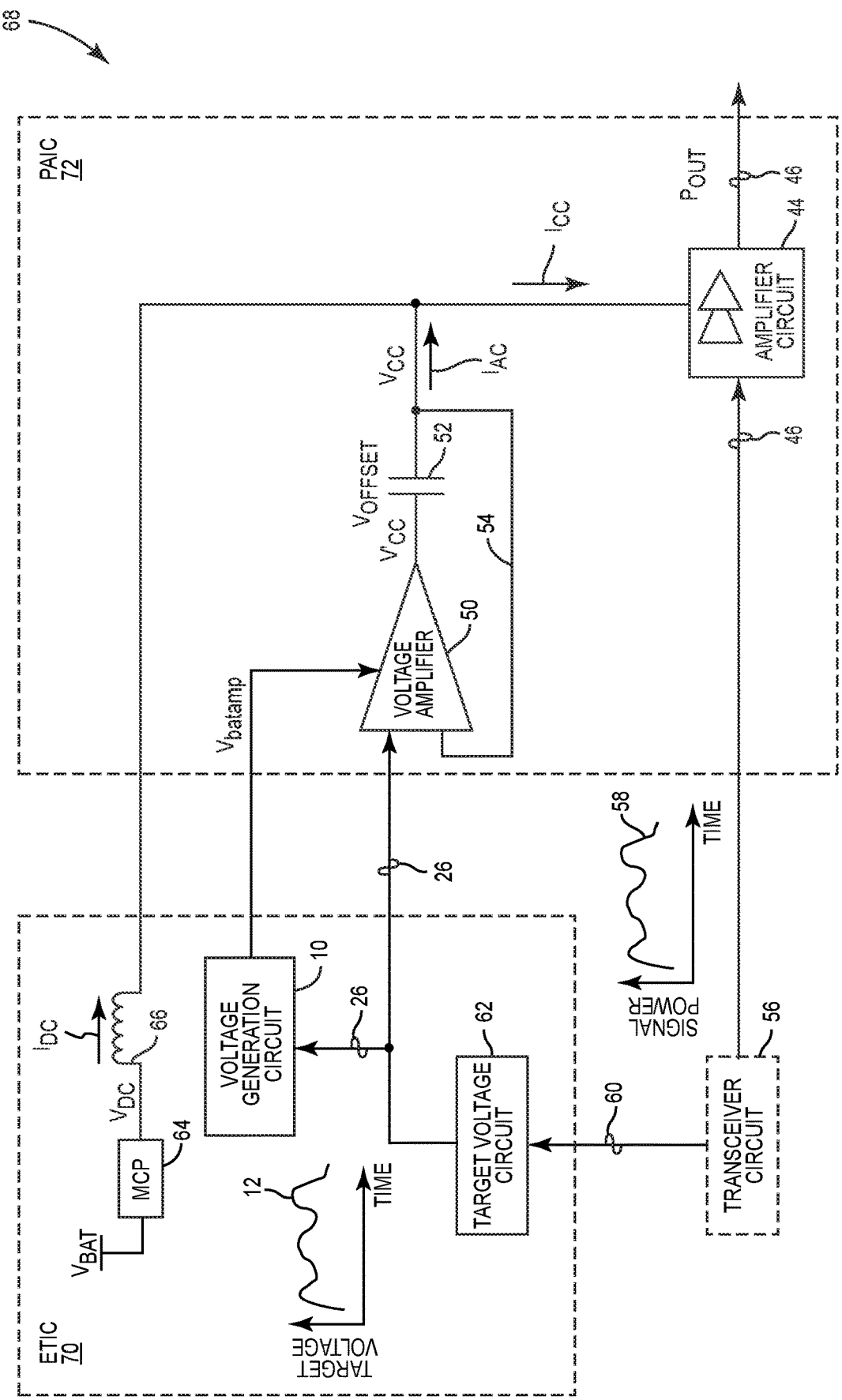
FIG. 4 is a schematic diagram of an exemplary ET amplifier apparatus configured to incorporate the voltage generation circuit of FIG. 1 according to another embodiment of the present disclosure.

The voltage generation circuit 10 of FIG. 1 can be provided in an ET amplifier apparatus to help improve efficiency and/or linearity of an amplifier circuit(s) in the ET amplifier apparatus. In this regard, FIG. 3 is a schematic diagram of an exemplary ET amplifier apparatus 42 configured to incorporate the voltage generation circuit 10 of FIG. 1 according to one embodiment of the present disclosure. Common elements between FIGS. 1 and 4 are shown therein with common element numbers and will not be re-described herein.

The ET amplifier apparatus 42 includes an amplifier circuit 44 configured to amplifier an RF signal 46 based on an ET voltage $V_{CC}$. The ET amplifier apparatus 42 includes an ET integrated IC (ETIC) 48 configured to generate and provide the ET voltage $V_{CC}$ to the amplifier circuit 44. Specifically, the ETIC 48 includes a voltage amplifier 50 configured to generate an initial ET voltage $V'_{CC}$ based on the selected supply voltage $V_{batamp}$ provided by the voltage generation circuit 10. The voltage amplifier 50 is coupled in series to an offset capacitor 52, which is configured to raise the initial ET voltage $V'_{CC}$ by a predefined offset voltage $V_{OFFSET}$ (e.g., 0.8V) to generate the ET voltage $V_{CC}$. The ETIC 48 may include a feedback loop 54 configured to provide a sample of the ET voltage $V_{CC}$ back to the voltage amplifier 50.

The amplifier circuit 44 and the ETIC 48 may be coupled to a transceiver circuit 56. The transceiver circuit 56 may be configured to generate the RF signal 46 that corresponds to a time-variant power envelope 58. To ensure that the amplifier circuit 44 can operate with desired efficiency and/or linearity, the ETIC may be configured to generate the ET voltage $V_{CC}$ that conforms to the time-variant power envelope 58 of the RF signal 46. By conforming to the time-variant power envelope 58, the ET voltage $V_{CC}$ may rise and fall in accordance to rise and fall of the time-variant power envelope 58.

In this regard, the ETIC 48 may receive a signal 60 corresponding to the time-variant power envelope 58 from the transceiver circuit 56. The ETIC 48 may include a target voltage circuit 62 configured to generate the target voltage signal 26 based on the signal 60. In a non-limiting example, the target voltage circuit 62 can include a look-up table (LUT) configured to convert the time-variant power envelope 58 into the time-variant target voltage envelope 12.

Subsequently, the target voltage circuit 62 may provide the target voltage signal 26 to the voltage generation circuit 10 for generating the selected supply voltage $V_{batamp}$ and to the voltage amplifier 50 for generating the ET voltage $V_{CC}$. Notably, it may be possible to configure the LUT in the target voltage circuit 62 such that the time-variant target voltage envelope 12 of the target voltage signal 26 can conform to the time-variant power envelope 58 of the RF signal 46. Accordingly, it may be possible for the ETIC 48 to generate the ET voltage $V_{CC}$ that rises and falls in accordance to rise and fall of the time-variant power envelope 58, thus helping to improve efficiency and/or linearity of the amplifier circuit 44.

The amplifier circuit 44 may be configured to amplify the RF signal 46 to an output power $P_{OUT}$ that corresponds to the ET voltage $V_{CC}$ and an ET current $I_{CC}$. The ET current $I_{CC}$ may consist of a low-frequency current $I_{DC}$ (e.g., a direct current) and a high-frequency current $I_{AC}$ (e.g., an alternating current). In a non-limiting example, the voltage amplifier 50 can be configured to source (e.g., when the time-variant power envelope 58 rises) or sink (e.g., when the time-variant power envelope 58 falls) the high-frequency current $I_{AC}$. The ETIC 48 may include a multi-level charge pump (MCP) 64 configured to generate a constant voltage $V_{DC}$ based on the battery voltage $V_{BAT}$. In a non-limiting example, the MCP 64 can be controlled to generate the constant voltage $V_{DC}$ at 0V, at the battery voltage $V_{BAT}$, or at two times the battery voltage $V_{BAT}$. The MCP 64 may be coupled in series to an inductor 66, which is configured to induce the low-frequency current $I_{DC}$ based on the constant voltage $V_{DC}$ and provide the low-frequency current $I_{DC}$ to the amplifier circuit 44.

FIG. 4 is a schematic diagram of an exemplary ET amplifier apparatus 68 configured to incorporate the voltage generation circuit 10 of FIG. 1 according to another embodiment of the present disclosure. Common elements between FIGS. 4 and 5 are shown therein with common element numbers and will not be re-described herein.

The ET amplifier apparatus 68 includes an ETIC 70 and a power amplifier IC (PAIC) 72. The ETIC 70 includes the voltage generation circuit 10, the target voltage circuit 62, the MCP 64, and the inductor 66. The PAIC 72 includes the amplifier circuit 44, the voltage amplifier 50, and the offset capacitor 52. In contrast to the ET amplifier apparatus 42 in FIG. 4, the voltage amplifier 50 is collocated with the amplifier circuit 44 in the PAIC 72. In this regard, the voltage amplifier 50 may be coupled to the amplifier circuit 44 over a shorter conductive length. As such, it may be possible to reduce trace inductance between the voltage amplifier 50 and the amplifier circuit 44 to a defined threshold (e.g., <0.4 nH). In this regard, it may be possible to reduce trace inductance-related distortion in the ET voltage $V_{CC}$, thus helping to improve efficiency and/or linearity of the amplifier circuit 44.

Figure 5:
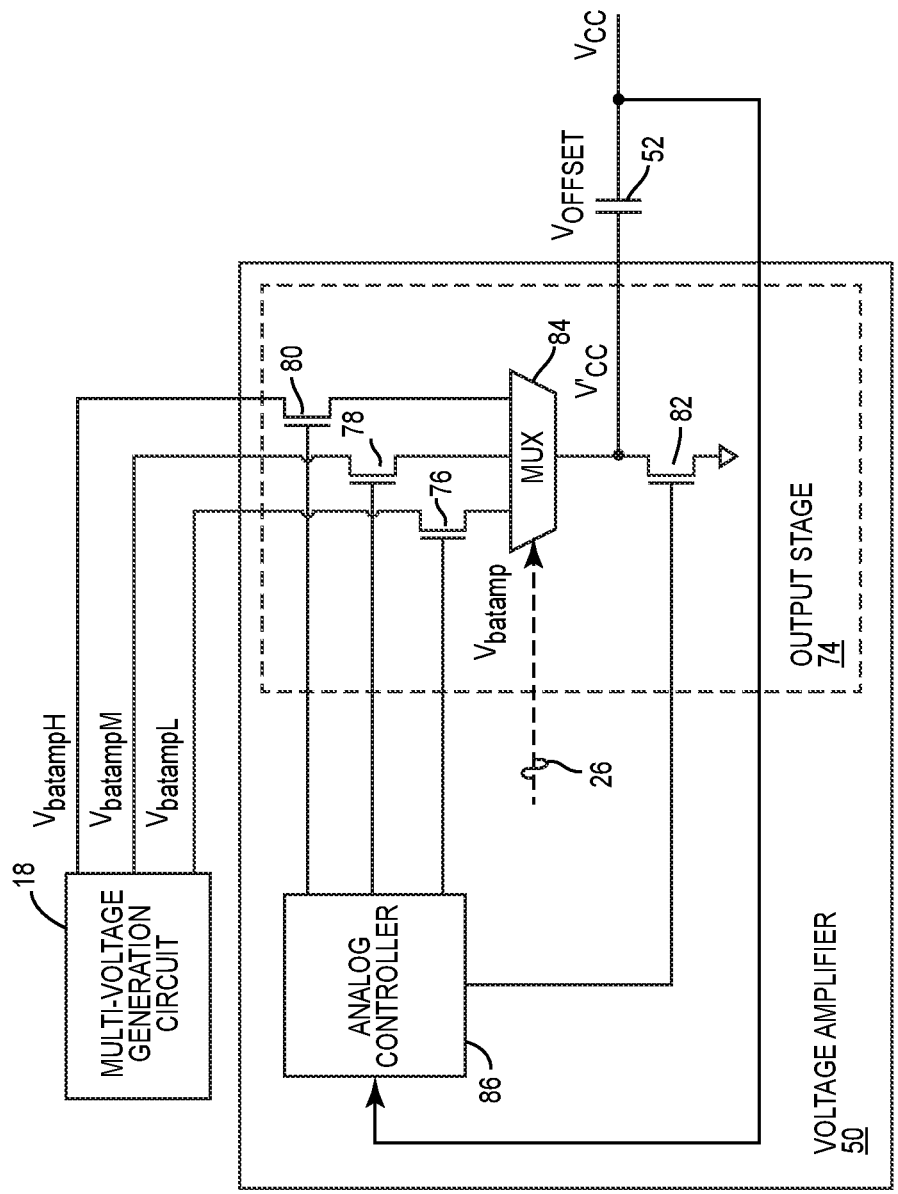
FIG. 5 is a schematic diagram of an exemplary voltage amplifier that can be provided in the ET amplifier apparatuses of FIGS. 3 and 4.

FIG. 5 is a schematic diagram providing an exemplary illustration of the voltage amplifier 50 in the ET amplifier apparatus 42 of FIG. 3 and the ET amplifier apparatus 68 of FIG. 4. Common elements between FIGS. 1, 3, 4, and 5 are shown therein with common element numbers and will not be re-described herein.

The voltage amplifier 50 includes an output stage 74. The output stage 74 includes a first input transistor 76, a second input transistor 78, a third input transistor 80, and an output transistor 82. In a non-limiting example, the first input transistor 76, the second input transistor 78, and the third input transistor 80 are p-type field-effect transistors (PFETs), while the output transistor 82 is an n-type FET (NFET). The first input transistor 76, the second input transistor 78, and the third input transistor 80 are coupled to the multi-voltage generation circuit 18 to receive the supply voltages $V_{batampL}$, $V_{batampM}$, and $V_{batampH}$, respectively. The output stage 74 also includes a multiplexer 84 (denoted as "MUX"). The multiplexer 84 is coupled to the output transistor 82.

The voltage amplifier 50 includes an analog controller 86 coupled to the first input transistor 76, the second input transistor 78, the third input transistor 80, and the output transistor 82. The analog controller 86 is configured to determine the selected supply voltage $V_{batamp}$ as being the closest supply voltage among the supply voltages $V_{batampL}$, $V_{batampM}$, and $V_{batampH}$ that is greater than or equal to the instantaneous target voltage 14 at the given time T. The analog controller 86 is further configured to cause the output transistor 82 to output the initial ET voltage $V'_{CC}$.

Those skilled in the art will recognize improvements and modifications to the embodiments of the present disclosure. All such improvements and modifications are considered within the scope of the concepts disclosed herein and the claims that follow.

What is claimed is:

1. A voltage generation circuit comprising:
   a voltage source configured to generate a constant voltage based on a battery voltage;
   a multi-voltage generation circuit configured to concurrently generate a plurality of supply voltages based on the constant voltage;
   a multiplexer coupled to the multi-voltage generation circuit and configured to receive the plurality of supply voltages; and
   a voltage controller configured to:
      receive a target voltage signal corresponding to a time-variant target voltage envelope;
      determine a selected supply voltage among the plurality of supply voltages based on the time-variant target voltage envelope; and
      provide a voltage selection signal to the multiplexer to output the selected supply voltage.

2. The voltage generation circuit of claim 1 wherein the voltage controller is further configured to:
   determine an instantaneous target voltage corresponding to the time-variant target voltage envelope;
   determine a closest supply voltage greater than or equal to the instantaneous target voltage among the plurality of supply voltages; and
   cause the voltage generation circuit to output the closest supply voltage as the selected supply voltage.

3. The voltage generation circuit of claim 1 wherein the voltage controller is further configured to:
   control the multi-voltage generation circuit to generate a low supply voltage, a medium supply voltage higher than the low supply voltage, and a high supply voltage higher than the medium supply voltage; and
   determine the selected supply voltage among the low supply voltage, the medium supply voltage, and the high supply voltage.

4. The voltage generation circuit of claim 3 wherein the voltage controller is further configured to control the multi-voltage generation circuit to generate the low supply voltage that equals the constant voltage.

5. The voltage generation circuit of claim 1 wherein the voltage controller is further configured to:
   control the multi-voltage generation circuit to generate a low supply voltage and a high supply voltage higher than the low supply voltage; and
   determine the selected supply voltage among the low supply voltage and the high supply voltage.

6. The voltage generation circuit of claim 5 wherein the voltage controller is further configured to control the multi-voltage generation circuit to generate the low supply voltage that equals the constant voltage and the high supply voltage that equals two times the low supply voltage.

7. The voltage generation circuit of claim 5 wherein the voltage controller is further configured to control the multi-voltage generation circuit to generate the low supply voltage that equals the constant voltage and the high supply voltage that equals the low supply voltage plus the battery voltage.

8. The voltage generation circuit of claim 1 wherein the voltage controller is further configured to:
   control the multi-voltage generation circuit to generate a low supply voltage; and
   determine the low supply voltage as the selected supply voltage.

9. The voltage generation circuit of claim 8 wherein the voltage controller is further configured to control the multi-voltage generation circuit to generate the low supply voltage that equals the constant voltage or equals the constant voltage plus the battery voltage.

10. An envelope tracking (ET) amplifier apparatus comprising:
an amplifier circuit configured to amplify a radio frequency (RF) signal based on an ET voltage and a target voltage signal corresponding to a time-variant target voltage envelope; and
an ET integrated circuit (ETIC) comprising:
a voltage amplifier configured to generate the ET voltage based on a supply voltage; and
a voltage generation circuit comprising:
a voltage source configured to generate a constant voltage based on a battery voltage;
a multi-voltage generation circuit configured to concurrently generate a plurality of supply voltages based on the constant voltage;
a multiplexer coupled to the multi-voltage generation circuit and configured to receive the plurality of supply voltages; and
a voltage controller configured to:
receive the target voltage signal corresponding to the time-variant target voltage envelope;
determine a selected supply voltage among the plurality of supply voltages based on the time-variant target voltage envelope; and
provide a voltage selection signal to the multiplexer to output the selected supply voltage to the voltage amplifier as the supply voltage.

11. The ET amplifier apparatus of claim 10 wherein the voltage controller is further configured to:
determine an instantaneous target voltage corresponding to the time-variant target voltage envelope;
determine a closest supply voltage greater than or equal to the instantaneous target voltage among the plurality of supply voltages; and
cause the voltage generation circuit to output the closest supply voltage as the selected supply voltage.

12. The ET amplifier apparatus of claim 10 wherein the voltage controller is further configured to:
control the multi-voltage generation circuit to generate a low supply voltage, a medium supply voltage higher than the low supply voltage, and a high supply voltage higher than the medium supply voltage; and
determine the selected supply voltage among the low supply voltage, the medium supply voltage, and the high supply voltage.

13. The ET amplifier apparatus of claim 10 wherein the voltage controller is further configured to:
control the multi-voltage generation circuit to generate a low supply voltage and a high supply voltage higher than the low supply voltage; and
determine the selected supply voltage among the low supply voltage and the high supply voltage.

14. The ET amplifier apparatus of claim 10 wherein the voltage amplifier comprises:
one or more input transistors coupled to the multi-voltage generation circuit to receive the plurality of supply voltages;
a multiplexer coupled to the one or more input transistors;
an output transistor coupled to the multiplexer; and
an analog controller coupled to the one or more input transistors and the output transistor, the analog controller is configured to control the one or more input transistors to provide the selected supply voltage to the multiplexer.

15. An envelope tracking (ET) amplifier apparatus comprising:
a power amplifier integrated circuit (PAIC) comprising:
an amplifier circuit configured to amplify a radio frequency (RF) signal based on an ET voltage and a target voltage signal corresponding to a time-variant target voltage envelope; and
a voltage amplifier configured to generate the ET voltage based on a supply voltage; and
an ET integrated circuit (ETIC) comprising a voltage generation circuit, the voltage generation circuit comprising:
a voltage source configured to generate a constant voltage based on a battery voltage;
a multi-voltage generation circuit configured to concurrently generate a plurality of supply voltages based on the constant voltage;
a multiplexer coupled to the multi-voltage generation circuit and configured to receive the plurality of supply voltages; and
a voltage controller configured to:
receive the target voltage signal corresponding to the time-variant target voltage envelope;
determine a selected supply voltage among the plurality of supply voltages based on the time-variant target voltage envelope; and
provide a voltage selection signal to the multiplexer to output the selected supply voltage to the voltage amplifier as the supply voltage.

16. The ET amplifier apparatus of claim 15 wherein the voltage controller is further configured to:
determine an instantaneous target voltage corresponding to the time-variant target voltage envelope;
determine a closest supply voltage greater than or equal to the instantaneous target voltage among the plurality of supply voltages; and
cause the voltage generation circuit to output the closest supply voltage as the selected supply voltage.

17. The ET amplifier apparatus of claim 15 wherein the voltage controller is further configured to:
control the multi-voltage generation circuit to generate a low supply voltage, a medium supply voltage higher than the low supply voltage, and a high supply voltage higher than the medium supply voltage; and
determine the selected supply voltage among the low supply voltage, the medium supply voltage, and the high supply voltage.

18. The ET amplifier apparatus of claim 15 wherein the voltage controller is further configured to:
control the multi-voltage generation circuit to generate a low supply voltage and a high supply voltage higher than the low supply voltage; and
determine the selected supply voltage among the low supply voltage and the high supply voltage.

19. The ET amplifier apparatus of claim 15 wherein the voltage amplifier comprises:
one or more input transistors coupled to the multi-voltage generation circuit to receive the plurality of supply voltages;
a multiplexer coupled to the one or more input transistors;
an output transistor coupled to the multiplexer; and
an analog controller coupled to the one or more input transistors and the output transistor, the analog controller is configured to control the one or more input transistors to provide the selected supply voltage to the multiplexer.

* * * * *